(12) United States Patent
Pelton et al.

(10) Patent No.: US 11,093,682 B2
(45) Date of Patent: Aug. 17, 2021

(54) LANGUAGE AND COMPILER THAT GENERATE SYNCHRONOUS DIGITAL CIRCUITS THAT MAINTAIN THREAD EXECUTION ORDER

(71) Applicant: MICROSOFT TECHNOLOGY LICENSING, LLC, Redmond, WA (US)

(72) Inventors: Blake D. Pelton, Redmond, WA (US); Adrian Michael Caulfield, Woodinville, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/247,269

(22) Filed: Jan. 14, 2019

(65) Prior Publication Data

US 2020/0226228 A1   Jul. 16, 2020

(51) Int. Cl.
  *G06F 30/398* (2020.01)
  *G06F 1/12* (2006.01)
  *G06F 8/41* (2018.01)

(52) U.S. Cl.
  CPC .............. *G06F 30/398* (2020.01); *G06F 1/12* (2013.01); *G06F 8/43* (2013.01)

(58) Field of Classification Search
  CPC . G06F 30/398; G06F 8/43; G06F 1/12; G06F 30/32; G06F 30/327; G06F 8/4452; G06F 8/41
  See application file for complete search history.

(56) References Cited

U.S. PATENT DOCUMENTS

| | | |
|---|---|---|
| 5,343,554 A | 8/1994 | Koza et al. |
| 5,416,719 A | 5/1995 | Pribetich |
| 5,642,304 A | 6/1997 | Simpson |
| 5,761,483 A | 6/1998 | Trimberger |
| 5,909,572 A | 6/1999 | Thayer et al. |

(Continued)

FOREIGN PATENT DOCUMENTS

| | | |
|---|---|---|
| WO | 2016094012 A1 | 6/2016 |
| WO | 2017084104 A1 | 5/2017 |

OTHER PUBLICATIONS

"Operand Forwarding", Retrieved From: https://en.wikipedia.org/w/index.php?title=Operand_forwarding&oldid=868126536, Retrieved on: Nov. 10, 2018, 2 Pages.

(Continued)

*Primary Examiner* — Nha T Nguyen
(74) *Attorney, Agent, or Firm* — Newport IP, LLC; Jacob P. Rohwer

(57) ABSTRACT

A multi-threaded programming language and compiler generates synchronous digital circuits that maintain thread execution order by generating pipelines with code paths that have the same number of stages. The compiler balances related code paths within a pipeline by adding additional stages to a code path that has fewer stages. Programming constructs that, by design, allow thread execution to be re-ordered, may be placed in a reorder block construct that releases threads in the order they entered the programming construct. First-in-first-out (FIFO) queues pass local variables between pipelines. Local variables are popped from FIFOs in the order they were pushed, preserving thread execution order across pipelines.

19 Claims, 8 Drawing Sheets

(56) References Cited

U.S. PATENT DOCUMENTS

| | | | |
|---|---|---|---|
| 6,061,521 A | 5/2000 | Thayer et al. | |
| 6,112,019 A | 8/2000 | Chamdani et al. | |
| 6,212,601 B1 | 4/2001 | Shiell | |
| 6,275,508 B1 | 8/2001 | Aggarwal et al. | |
| 6,597,664 B1* | 7/2003 | Mithal | G06F 30/30 370/252 |
| 7,028,281 B1 | 4/2006 | Agrawal et al. | |
| 7,111,273 B1 | 9/2006 | Ganesan et al. | |
| 7,203,718 B1 | 4/2007 | Fu et al. | |
| 7,305,582 B1 | 12/2007 | Moser et al. | |
| 7,315,991 B1 | 1/2008 | Bennett | |
| 7,375,550 B1 | 5/2008 | Redgrave et al. | |
| 7,386,820 B1* | 6/2008 | Koelbl | G06F 30/3323 716/107 |
| 7,415,681 B2 | 8/2008 | Tomar et al. | |
| 7,471,104 B1 | 12/2008 | Chirania | |
| 7,516,446 B2 | 4/2009 | Choi et al. | |
| 7,647,567 B1* | 1/2010 | Esposito | G06F 30/3323 716/132 |
| 7,735,047 B1 | 6/2010 | Anderson et al. | |
| 7,735,050 B2 | 6/2010 | Yu et al. | |
| 7,823,117 B1 | 10/2010 | Bennett | |
| 7,844,924 B2 | 11/2010 | Sasao et al. | |
| 8,095,508 B2 | 1/2012 | Chamberlain et al. | |
| 8,209,580 B1 | 6/2012 | Varnica et al. | |
| 8,468,510 B1* | 6/2013 | Sundararajan | G06F 30/34 717/152 |
| 8,599,049 B2 | 12/2013 | Wang et al. | |
| 8,620,881 B2 | 12/2013 | Chamberlain et al. | |
| 8,656,347 B2 | 2/2014 | Ito | |
| 8,671,371 B1* | 3/2014 | Dimond | G06F 30/327 716/104 |
| 8,775,986 B1 | 7/2014 | Mohan et al. | |
| 8,881,079 B1* | 11/2014 | Pan | G06F 30/3312 716/111 |
| 8,930,926 B2 | 1/2015 | Bastoul et al. | |
| 9,471,307 B2 | 10/2016 | Giroux et al. | |
| 9,690,278 B1* | 6/2017 | Chen | G05B 19/0423 |
| 9,824,756 B2 | 11/2017 | Brand et al. | |
| 9,846,623 B2 | 12/2017 | Jennings et al. | |
| 9,858,373 B2* | 1/2018 | Cho | G06F 30/327 |
| 10,162,918 B1 | 12/2018 | Iyer et al. | |
| 10,331,836 B1 | 6/2019 | Hosangadi et al. | |
| 10,474,533 B2 | 11/2019 | Jennings et al. | |
| 2002/0080174 A1 | 6/2002 | Kodosky et al. | |
| 2003/0154466 A1 | 8/2003 | Snider | |
| 2005/0050531 A1 | 3/2005 | Lee | |
| 2006/0075180 A1 | 4/2006 | Tian et al. | |
| 2006/0120189 A1* | 6/2006 | Beerel | G06F 30/35 365/203 |
| 2006/0268939 A1 | 11/2006 | Dries et al. | |
| 2007/0094474 A1 | 4/2007 | Wilson et al. | |
| 2007/0143717 A1* | 6/2007 | Koelbl | G06F 30/3323 716/103 |
| 2007/0171101 A1 | 7/2007 | Siemers et al. | |
| 2007/0174804 A1 | 7/2007 | Sasao et al. | |
| 2007/0180334 A1 | 8/2007 | Jones et al. | |
| 2007/0300192 A1* | 12/2007 | Curtin | G06F 30/392 716/113 |
| 2008/0005357 A1 | 1/2008 | Malkhi et al. | |
| 2008/0075278 A1 | 3/2008 | Gaubatz et al. | |
| 2008/0111721 A1 | 5/2008 | Reznik | |
| 2008/0111722 A1 | 5/2008 | Reznik | |
| 2008/0229141 A1 | 9/2008 | Chang et al. | |
| 2008/0313579 A1 | 12/2008 | Larouche et al. | |
| 2009/0210412 A1 | 8/2009 | Oliver et al. | |
| 2009/0243732 A1 | 10/2009 | Tarng et al. | |
| 2010/0162049 A1 | 6/2010 | Stall et al. | |
| 2011/0078640 A1 | 3/2011 | Bruneel | |
| 2012/0065956 A1* | 3/2012 | Irturk | G06F 30/30 703/21 |
| 2013/0013301 A1 | 1/2013 | Subbaraman et al. | |
| 2013/0054939 A1* | 2/2013 | Felch | G06F 15/78 712/42 |
| 2013/0081060 A1 | 3/2013 | Otenko | |
| 2013/0100750 A1 | 4/2013 | Ishiguro et al. | |
| 2013/0111425 A1* | 5/2013 | Kumar | G06F 30/327 716/104 |
| 2013/0111453 A1* | 5/2013 | Kalogeropulos | G06F 8/4452 717/161 |
| 2013/0125097 A1* | 5/2013 | Ebcioglu | G06F 8/452 717/136 |
| 2013/0139122 A1 | 5/2013 | Pell et al. | |
| 2013/0212365 A1* | 8/2013 | Chen | G06F 30/398 713/1 |
| 2013/0226594 A1 | 8/2013 | Fuchs et al. | |
| 2013/0298130 A1* | 11/2013 | Pienaar | G06F 9/4887 718/102 |
| 2013/0335853 A1 | 12/2013 | Li et al. | |
| 2014/0059524 A1 | 2/2014 | Kee et al. | |
| 2014/0237437 A1 | 8/2014 | Mang et al. | |
| 2015/0052298 A1 | 2/2015 | Brand et al. | |
| 2015/0178418 A1 | 6/2015 | Gu et al. | |
| 2015/0178435 A1 | 6/2015 | Kumar | |
| 2015/0295552 A1 | 10/2015 | Abou-chahine et al. | |
| 2015/0304068 A1 | 10/2015 | Xiong et al. | |
| 2016/0087651 A1 | 3/2016 | Lu | |
| 2016/0180001 A1 | 6/2016 | Adler | |
| 2016/0246571 A1 | 8/2016 | Walters, III | |
| 2016/0259023 A1 | 9/2016 | Overall et al. | |
| 2016/0299998 A1* | 10/2016 | Isshiki | G06F 30/327 |
| 2017/0140513 A1 | 5/2017 | Su et al. | |
| 2017/0185508 A1 | 6/2017 | Looney et al. | |
| 2017/0192921 A1 | 7/2017 | Wang et al. | |
| 2017/0251211 A1 | 8/2017 | Froehlich et al. | |
| 2017/0277656 A1 | 9/2017 | John et al. | |
| 2017/0316154 A1 | 11/2017 | Fitch et al. | |
| 2018/0129475 A1 | 5/2018 | Almagambetov et al. | |
| 2018/0143872 A1 | 5/2018 | Sun et al. | |
| 2018/0232475 A1* | 8/2018 | Derisavi | G06F 30/398 |
| 2018/0253368 A1 | 9/2018 | Villarreal et al. | |
| 2018/0255206 A1 | 9/2018 | Kim et al. | |
| 2018/0330022 A1 | 11/2018 | Choi et al. | |
| 2018/0342040 A1 | 11/2018 | Nguyen et al. | |
| 2018/0347498 A1 | 12/2018 | Maloney | |
| 2019/0114548 A1* | 4/2019 | Wu | G06N 3/086 |
| 2019/0138365 A1 | 5/2019 | Purnell et al. | |
| 2019/0303153 A1 | 10/2019 | Halpern et al. | |
| 2020/0167139 A1 | 5/2020 | Drepper | |
| 2020/0225919 A1 | 7/2020 | Pelton et al. | |
| 2020/0225920 A1 | 7/2020 | Pelton et al. | |
| 2020/0225921 A1 | 7/2020 | Pelton et al. | |
| 2020/0226051 A1 | 7/2020 | Pelton et al. | |
| 2020/0226227 A1 | 7/2020 | Pelton et al. | |
| 2021/0049163 A1 | 2/2021 | Levy et al. | |

OTHER PUBLICATIONS

"Register File", Retrieved From: https://en.wikipedia.org/wiki/Register_file, Retrieved on: Dec. 13, 2019, 8 Pages.

"Re-order Buffer", Retrieved From: https://en.wikipedia.org/wiki/Re-order_buffer, Retrieved on: Dec. 13, 2019, 1 Page.

"Non Final Office Action Issued in U.S. Appl. No. 16/247,226", dated Sep. 4, 2020, 33 Pages.

"Non-Final Office Action Issued in U.S. Appl. No. 16/247,250", dated Dec. 27, 2019, 14 Pages.

"Ex Parte Quayle Action Issued in U.S. Appl. No. 16/247,261", Mailed Date: Feb. 4, 2020, 7 Pages.

Cong, et al., "Combinational Logic Synthesis for LUT Based Filed Programmable Gate Arrays", In Proceedings of the ACM Transactions on Design Automation of Electronic Systems, Apr. 1996, pp. 145-204.

Tan, et al., "Mapping-Aware Constrained Scheduling for LUT-Based FPGAs", In Proceedings of the ACM/SIGDA International Symposium on Field-Programmable Gate Arrays, Feb. 22, 2015, 10 Pages.

"Non-Final Office Action Issued in U.S. Appl. No. 16/247,181", dated Jul. 9, 2020, 11 Pages.

"Final Office Action Issued in U.S. Appl. No. 16/247,250", dated Apr. 13, 2020, 22 Pages.

(56) References Cited

OTHER PUBLICATIONS

Ditmar, et al., "Function Call Optimisation in SystemC Hardware Compilation", In Proceedings of 4th Southern Conference on Programmable Logic, Mar. 26, 2008, pp. 93-98.
"International Search Report and Written Opinion Issued in PCT Application No. PCT/US2019/069028", dated Apr. 24, 2020, 13 Pages.
"International Search Report and Written Opinion Issued in PCT Application No. PCT/US2019/069031", dated May 4, 2020, 13 Pages.
"International Search Report and Written Opinion Issued in PCT Application No. PCT/US2019/069032", dated Apr. 24, 2020, 13 Pages.
"International Search Report and Written Opinion Issued in PCT Application No. PCT/US2020/012278", dated Apr. 6, 2020, 15 Pages.
"International Search Report and Written Opinion Issued in PCT Application No. PCT/US2019/069030", dated Mar. 27, 2020, 11 Pages.
Arar, Steve, "Concurrent Conditional and Selected Signal Assignment in VHDL", https://www.allaboutcircuits.com/technical-articles/concurrent-conditional-and-selected-signal-assignment-in-vhdl/, Jan. 3, 2018, 8 Pages.
Galloway, et al., "The Transmogrifier C hardware description language and compiler for FPGAs", In Proceedings IEEE Symposium on FPGAs for Custom Computing Machines, Apr. 19, 1995, pp. 136-144.

"International Search Report and Written Opinion Issued in PCT Application No. PCT/US2019/069034", dated Jun. 23, 2020, 19 Pages.
"Non-Final Office Action Issued in U.S. Appl. No. 16/247,203", dated Nov. 9, 2020, 8 Pages.
"Non Final Office Action Issued in U.S. Appl. No. 16/247,250", dated Nov. 12, 2020, 18 Pages.
"Final Office Action Issued in U.S. Appl. No. 16/247,226", dated Mar. 18, 2021, 41 Pages.
"Final Office Action Issued in U.S. Appl. No. 16/247,181", dated Jan. 28, 2021, 16 Pages.
"Notice of Allowance issued in U.S. Appl. No. 16/247,250", dated Apr. 14, 2021, 25 Pages.
Hatami, et al., "High Performance Architecture for Flow-Table Lookup in SDN on FGPA", In Repository of arXiv:1801.00840, Jan. 2, 2018, 15 Pages.
"Notice of Allowance Issued in U.S. Appl. No. 16/247,203", dated Jun. 3, 2021, 8 Pages.
"Non Final Office Action Issued in U.S. Appl. No. 16/247,181", dated Jun. 9, 2021, 13 Pages.
Steinberg, et al., "Automatic High-level Programs Mapping onto Programmable Architectures", In Proceedings of International Conference on Parallel Computing Technologies, Jul. 25, 2015, pp. 474-485.
"Notice of Allowance Issued in U.S. Appl. No. 16/247,226", dated Jun. 25, 2021, 14 Pages.

* cited by examiner

LANGUAGE AND COMPILER THAT GENERATE SYNCHRONOUS DIGITAL CIRCUITS THAT MAINTAIN THREAD EXECUTION ORDER

BACKGROUND

Hardware description languages ("HDLs") are modeling languages used by hardware engineers to describe the structure and behavior of electronic circuits, most commonly digital logic circuits. Examples of HDLs include Very High Speed Integrated Circuit ("VHSIC") HDL and VERILOG.

HDLs commonly require many lines of code to model digital logic circuits. Even for hardware engineers that are very familiar with HDLs, creation of such code can be extremely time consuming. Moreover, the more lines of code present in a design, the more likely it is for the design to include errors or perform poorly.

Because HDLs typically utilize a different programming paradigm than imperative programming languages, software engineers that are not intimately familiar with HDLs commonly have a very difficult time utilizing these languages. As a result, electronic circuits generated from HDL created by software engineers can also include errors or perform poorly.

It is with respect to these and other technical challenges that the disclosure made herein is presented.

SUMMARY

Technologies are disclosed for a language and compiler that generate synchronous digital circuits that maintain thread execution order. Through implementations of the disclosed technologies, hardware engineers can realize significant productivity gains by reducing the number of lines of code required to implement some types of circuit designs, and by eliminating whole classes of common design errors, while at the same time not sacrificing performance. For software engineers who have little or no experience with using HDLs to design circuits, the disclosed technologies offer familiar programming semantics that can be used to generate high performance circuit designs.

Implementations of the disclosed technologies can also generate hardware circuits that can maintain thread execution order. Maintaining thread execution order enables optimizations such as low-overhead thread synchronization. Maintaining thread execution order also allows programmers to perform order specific operations. For example, threads in an even execution order (e.g. threads '2', '4', '6' . . . ) may be treated differently throughout a program than threads in an odd execution order. Also, special operations may be performed when a thread is a first thread or a last thread to be executed. Other technical benefits not specifically mentioned herein can also be realized through implementations of the disclosed subject matter.

In order to realize the technical benefits mentioned briefly above, the disclosed language and compiler generate pipelines with code paths that have the same number of stages. For example, all code paths of a first pipeline may have 6 stages, while all code paths of a second pipeline may have 15 stages. In order to maintain this property, the compiler balances related code paths within a pipeline. For instance, for a given 'if' statement, either the 'then' block or the 'else' block may be padded so as to have the same number of stages as the other. Stages may be added by adding dummy stages that do not perform useful work, or stages may be added by increasing pipeline depth—i.e. increasing the number of stages used to implement the block. By balancing the number of stages in the 'then' and 'else' blocks, all threads execute the 'if' statement in the same number of clock cycles, and so threads leave the 'if' statement in the order they entered it.

Some programming constructs allow thread execution to be re-ordered by design. For example, thread execution order is not guaranteed for a loop, because different threads may execute the loop a different number of times. As such, one thread may complete a loop in 10 iterations, while another thread may complete the same loop in 500 iterations. However, the disclosed language includes a reorder block that ensures threads leave the reorder block in the order they entered it. Programmers may wrap loops and other non-order-preserving constructs with a reorder block to maintain thread execution order. Additionally, or alternatively, the disclosed language may include loop constructs that "build-in" the reorder block functionality. For example, a "reorder_for" loop operates as a "for" loop that preserves thread execution order. In some configurations, the reorder block is implemented with a re-order buffer on the SDC.

In some configurations, pipelines of execution are connected by first-in-first-out queues (referred to has 'queues' or 'FIFOs') that store local variables for use by another pipeline. FIFOs may be used to implement function calls, control flow, and other aspects of the disclosed language. Thread order is maintained across pipelines by retrieving local variables from FIFOs in the order they were enqueued.

As discussed briefly above, implementations of the technologies disclosed herein provide low-overhead thread synchronization. Furthermore, programmers are enabled to perform order specific operations, such as treating even and odd threads differently, or performing special operations for a first or last thread. Other technical benefits not specifically identified herein can also be realized through implementations of the disclosed technologies.

It should be appreciated that the above-described subject matter can be implemented as a computer-controlled apparatus, a computer-implemented method, a computing device, or as an article of manufacture such as a computer readable medium. These and various other features will be apparent from a reading of the following Detailed Description and a review of the associated drawings.

This Summary is provided to introduce a brief description of some aspects of the disclosed technologies in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

DETAILED DESCRIPTION

Figure 1:
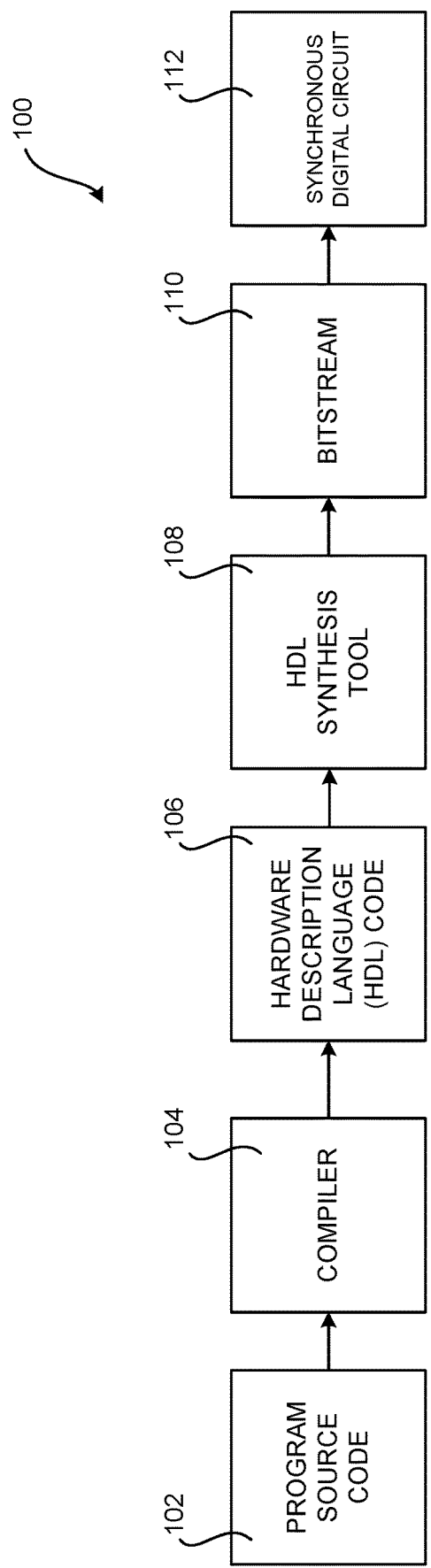
FIG. 1 is a computing architecture diagram that shows aspects of a system disclosed herein for generating a synchronous digital circuit based on program source code that includes a programming construct that maps to the synchronous digital circuit.

The following detailed description is directed to a language and compiler that maintains thread execution order. As discussed briefly above, maintaining thread execution order enables optimizations such as low-overhead thread synchronization. Maintaining thread execution order also allows programmers to implement order-specific operations. For example, threads in an even execution order may be treated differently throughout a program than threads in an odd execution order. Also, special operations may be performed when a thread is a first thread or a last thread to be executed. Other technical benefits not specifically mentioned herein can also be realized through implementations of the disclosed subject matter.

While the subject matter described herein is presented in the general context of a language and compiler that maintains thread execution order, those skilled in the art will recognize that other implementations can be performed in combination with other types of computing systems and modules. Those skilled in the art will also appreciate that the subject matter described herein can be practiced with other computer system configurations, including hand-held devices, multiprocessor systems, microprocessor-based or programmable consumer electronics, computing or processing systems embedded in devices (such as wearable computing devices, automobiles, home automation etc.), mini-computers, mainframe computers, and the like.

In the following detailed description, references are made to the accompanying drawings that form a part hereof, and which are shown by way of illustration specific configurations or examples. Referring now to the drawings, in which like numerals represent like elements throughout the several FIGS., aspects of a language and compiler that maintains thread execution order will be described.

FIG. 1 is a computing architecture diagram that shows aspects of an illustrative system 100 disclosed herein for defining and generating a synchronous digital circuit ("SDC") 112 based on program source code 102 that includes a programming construct that maps to the SDC 112. SDCs 112 can be implemented by Gate Arrays, Field Programmable Gate Arrays ("FPGAs"), Application Specific Integrated Circuits ("ASICs"), and other types of circuit devices. While the disclosed subject matter is primarily described in the context of an SDC 112 implemented in an FPGA, it is to be appreciated that the technologies disclosed herein can be utilized to define SDCs 112 that are implemented using other types of devices.

As illustrated in FIG. 1, the illustrative system 100 includes a compiler 104 that compiles program source code 102 to generate hardware description language ("HDL") code 106 or a lower-level representation of a circuit, such as a netlist. As discussed briefly above, HDLs are modeling languages used by hardware engineers to describe the structure and behavior of electronic circuits, most commonly digital logic circuits. Examples of HDLs include VHSIC HDL and VERILOG.

As will be described in detail below, the program source code 102 is expressed using a multi-threaded imperative programming language designed to target SDCs 112. The disclosed language provides many of the features of languages such as 'C' and 'JAVA, such as function calls, for-loops, arithmetic operators, and conditional statements. However, the disclosed language includes constructs that map directly to an underlying SDC 112 hardware implementation. This enables both hardware and software engineers to reason about performance, and to be effective in optimizing their designs. As mentioned above, this can also make the language familiar to software engineers, and free hardware engineers from dealing with whole classes of bugs that arise when coding in an HDL.

The disclosed multi-threaded imperative programming language is imperative, in that program statements are executed one after another, and multi-threaded in that multiple threads of execution can be executing in parallel. As discussed above, a thread is a collection of local variables. Threads are executed as the local variables are processed by a hardware circuit.

The threads described herein are analogous to, yet different, from software threads. While a software thread maintains a call stack containing local variables and executes code in memory, the threads described herein are collections of local variables that move through hardware circuits. While a software thread has a location in executable code determined by an instruction pointer, the disclosed thread has a physical location on the SDC at a given point in time. SDCs may execute hundreds, thousands, or even millions of threads, and SDC execution may be pipelined—i.e. different threads may execute within different stages of a circuit at the same time.

As will be described in greater detail below, language constructs can be defined in the program source code 102 that map to a circuit implementation. A language construct is a syntactically allowable part of a program that may be formed from one or more lexical tokens. The language constructs described herein map to circuit implementations that guarantee thread ordering (i.e. that threads will exit a circuit implementation in the same order that they entered).

As will also be described in greater detail below, the circuit implementations generated by the constructs disclosed herein can be implemented as an SDC in an FPGA, a gate array, an ASIC, or another type of suitable device. Another hardware component, such as a NIC, can be configured with the FPGA, gate array, or ASIC, in order to implement desired functionality.

As shown in FIG. 1, a compiler 104 can compile the program source code 102 including one or more of the language constructs disclosed herein to a circuit description, HDL code 106 in this example. The HDL code 106 can be provided to an HDL synthesis tool 108 which, in turn, can generate a bitstream 110 that can be utilized to program an SDC 112, such as for instance on an FPGA. When targeting an ASIC, the HDL code 106 can be provided to an ASIC fabricator for production in a factory.

Figure 2:
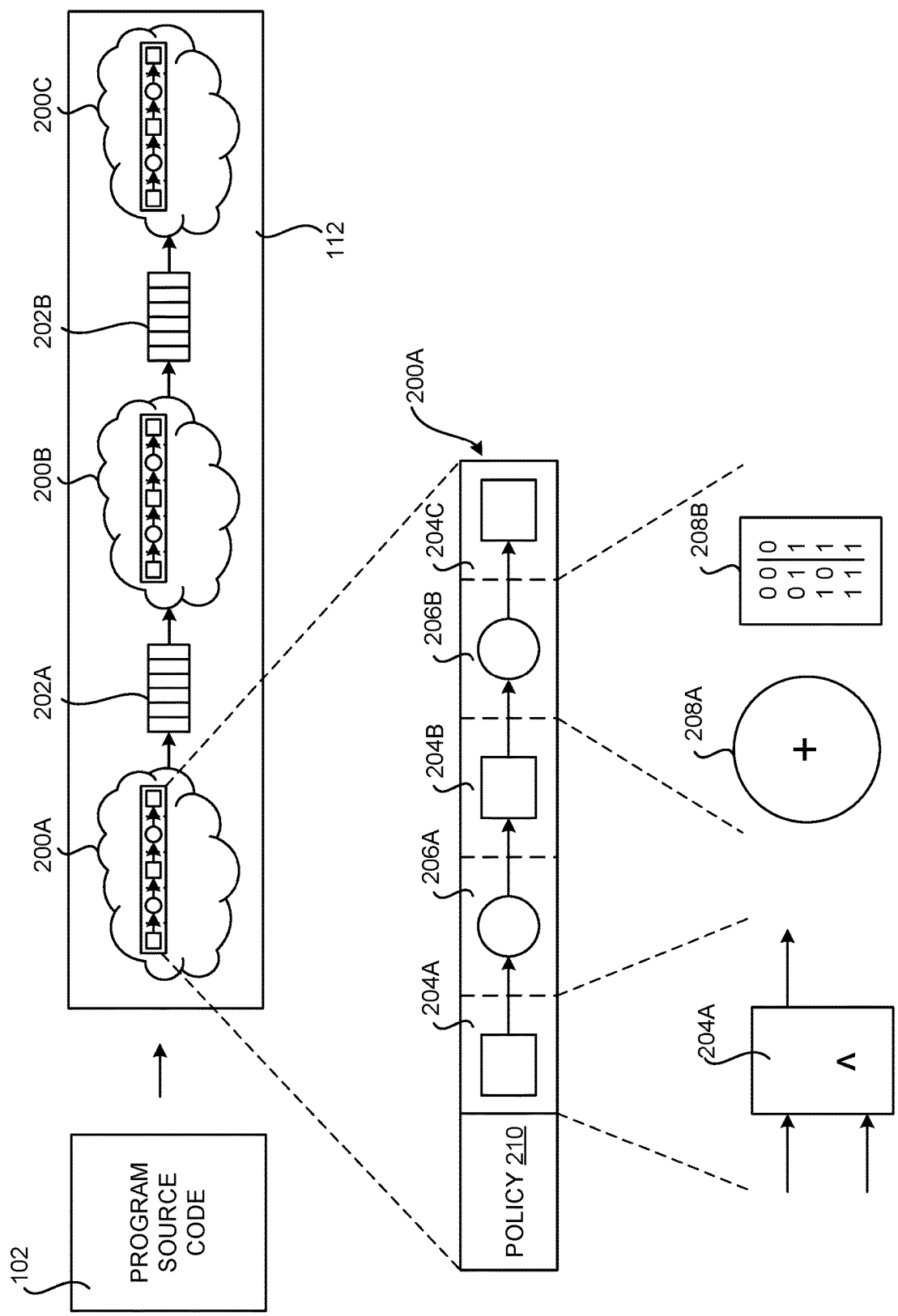
FIG. 2 is a hardware architecture diagram showing aspects of an illustrative example synchronous digital circuit, that includes several hardware pipelines, each having multiple pipeline stages, and computational units that can be defined and implemented using the disclosed technologies.

FIG. 2 is a hardware architecture diagram showing aspects of an illustrative example SDC 112 that includes several hardware pipelines 200A-200C (or "pipelines") that can be defined and implemented using the disclosed technologies. Each hardware pipeline has multiple pipeline stages 206, each of which has computational units 208. As shown in FIG. 2, the program source code 102 can be compiled into pipelines 200A-200C of hardware computational units 208.

The pipelines 200A-200C can be connected by first-in-first-out ("FIFO") queues (which might be referred to herein as "FIFOs" or "queues"). The pipelines 200A-200C implement the functionality defined by the program source code 102. The FIFOs 202 store data values, providing input to pipelines 200 as well as storing output generated by pipelines 200. For example, the SDC 112 includes a pipeline 200A that feeds its output to the FIFO 202A. Pipeline 200B, in turn, obtains its input from the FIFO 202A and provides its output to the FIFO 202B. The pipeline 200C obtains its input from the FIFO 202B.

In some configurations, the pipelines 200 implement a policy circuitry 210 that determines when to retrieve the next value(s) from a FIFO 202. For example, policy circuit 210 may require that an input FIFO (e.g. the FIFO 202A in the case of the pipeline 200B) is not empty and an output FIFO (e.g. the FIFO 202B) is not full before retrieving a value from the input FIFO (e.g. the FIFO 202A) for processing.

As shown in FIG. 2, a pipeline 200 may consist of one or more pipeline stages 206A-206B. Execution is pipelined by executing different threads in different stages 206 of a pipeline 200 concurrently. The results of stages can be stored in registers 204 and provided to the next stage 206 for the duration of the next clock cycle.

Each pipeline stage 206 can include one or more computational units 208, such as adder 208A and lookup table ("LUT") 208B. In the illustrated example, adder 208A can perform basic arithmetic, e.g. addition, subtraction, or multiplication. Computational units can also implement Boolean operators (e.g. "OR", "NOR", "XOR", etc.) or other custom logic provided by the SDC manufacturer.

Computational units can also be implemented by user-programmable lookup tables 208B. The illustrated LUT 208B depicts a two-input truth table that maps two input bits to a single output bit. LUTs 208B can be configured to support different numbers of input bits. To generate more complex output values, e.g. characters or 8-bit integers, multiple LUTs 208B, each connected to a different bit of an input variable, may be used.

Computational units can temporarily store results in registers 204 (or "flip-flops"). The contents of such a register can be provided to other computation units in the same or different pipeline 200. Registers 204 can capture a value at an input when a connected digital clock transitions from 0 to 1, and provide that value at an output until the end of the next clock cycle (i.e. until the clock transitions from 0 to 1 again). Registers can also include an enable line. If an enable line is set to false, then the register will not perform the operations described above, maintaining the current output value over multiple clock cycles.

It is to be appreciated that the pipeline architecture shown in FIG. 2 has been simplified for discussion purposes. The programming language constructs described herein can be utilized to implement much more complex SDCs 112 that include many more components than illustrated in FIG. 2.

Figure 3:
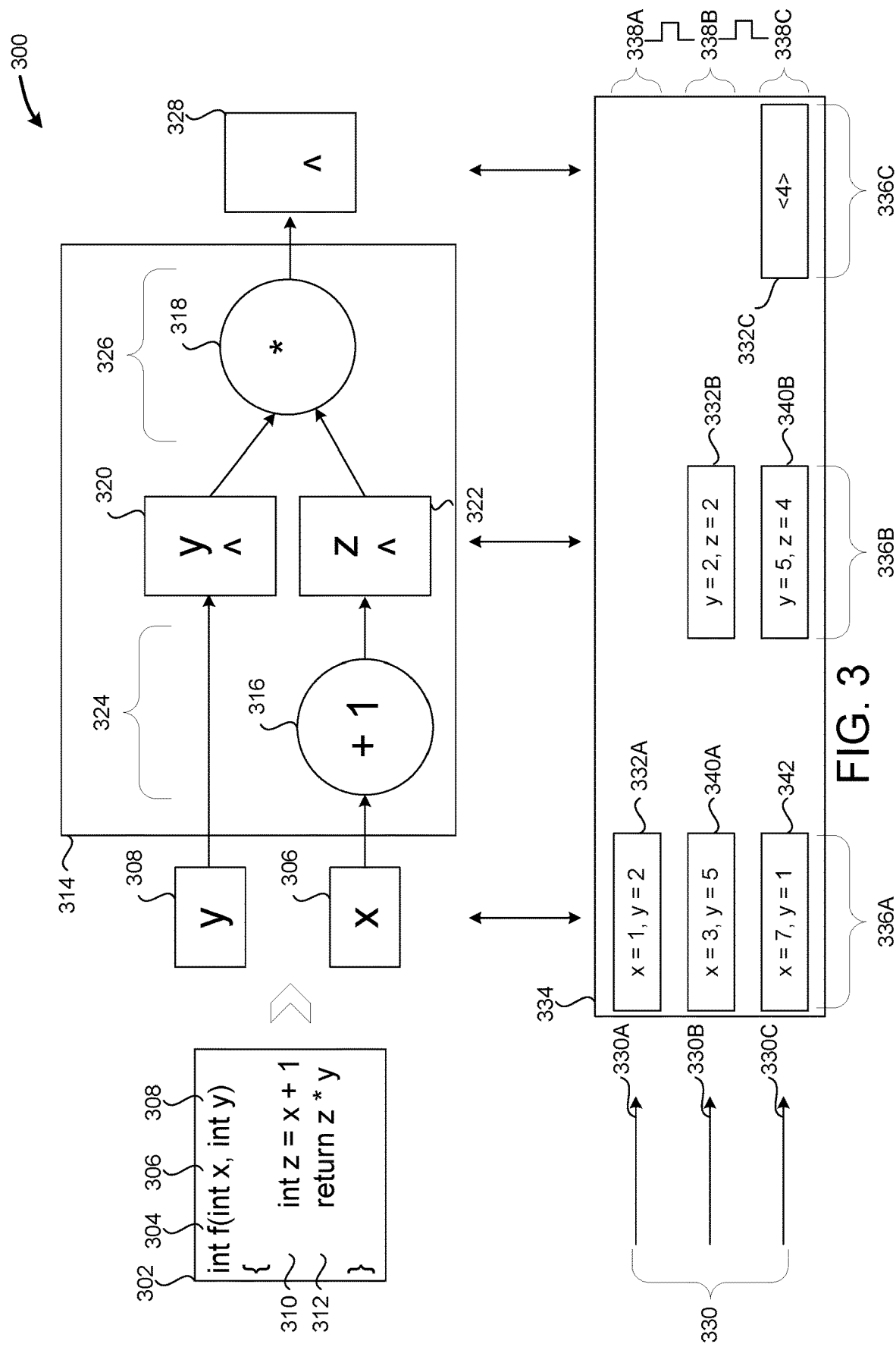
FIG. 3 is a hardware architecture diagram that shows mapping a function written in the disclosed language to a hardware circuit.

FIG. 3 is a hardware architecture diagram 300 that shows mapping a function written in the disclosed language to a hardware circuit, according to one embodiment. Program source code 302 includes a function 'f( )' 304 written in the disclosed language. The disclosed language is imperative, in that program statements are executed one after another, and multi-threaded in that multiple threads of execution can be executing in parallel and/or concurrently. Function 'f( )' 304 takes two parameters, 'x' 306 and 'y' 308, and returns an integer. Function 'f( )' 304 has two expressions: expression 310 performs an addition and stores the result in local variable 'z', while expression 312 returns the result of a multiplication.

Function 'f( )' is 304 mapped to a hardware circuit 314, which includes computational units 316 and 318 and registers 320 and 322. Hardware circuit 314 has two stages—a first stage 324 that performs the addition described in expression 310, and a second stage 326 that performs the multiplication described in expression 312. Each stage is executed in a single clock cycle, and the result of each stage is stored in one or more registers.

Continuing the example, stage 324 performs a "+1" operation on parameter 'x' 306, storing the result ('z') in register 322. During stage 324, parameter 'y' 308 is provided to register 320 directly. During stage 326, computational unit 318 multiplies the values of 'y' and 'z'. The result is stored in register 328.

Hardware circuit 314 may be executed by threads 330, only some of which are depicted. SDCs may execute hundreds, thousands, or millions of threads. A thread refers to a collection of local variables. Threads are executed as the local variables are processed by a hardware circuit. For example, thread 330A has the values 332 (x=1 and y=2), and thread 330A executes function 'f( )' 304 as the values 332 are processed by hardware circuit 314. Values returned by a function may be added to a set of local variables, and at any time if it is known that a particular variable will no longer be used by a hardware circuit, that variable may be removed from the set of local variables.

The disclosed threads are analogous to, yet different, from software threads. While a software thread maintains a call stack containing local variables and executes code in memory, the disclosed thread is a collection of local variables that moves through hardware circuits. While a software thread has a location in executable code determined by an instruction pointer, the disclosed thread has a physical location on the SDC at a given point in time.

SDC execution may be pipelined—i.e. different threads may execute within different stages of a circuit at the same time. Table 334 depicts variables from different threads in different stages as pipelined execution of hardware circuit 314 occurs. Columns 336 display values stored between (i.e. before and after) stages: 336A contains values of x and y provided by threads 330A, 330B, and 330C, while column 336B contains values after stage 324 has been executed and column 336C contains values after stage 326 has been executed. Rows 338A-C display values stored after successive clock cycles.

For instance, row 338A indicates that thread 330A is about to enter hardware circuit 314 with the values 332A (x=1 and y=2). Between rows 338A and 338B, a clock cycle occurs, and the results of executing thread 330A in stage 324 are depicted in 332B (y=2, a holdover from 332A, and z=2, the result of the "+1" operation). At the same time, the values 340A from thread 330B (x=3 and y=5) are about to enter hardware circuit 314. Between rows 338B and 338C another clock cycle occurs, and the result of thread 330A executing stage 326 is depicted in 332C ("4"). At the same time, the result of thread 330B executing stage 324 is depicted in 340B (y=5 and z=4), and the values 342 from thread 330C are about to enter hardware circuit 314 (x=7 and y=1). Pipelined execution enables higher throughput by increasing SDC utilization—i.e. more of the SDC is performing useful work at a given point in time than if only one thread at a time could execute hardware circuit 305.

Figure 4:
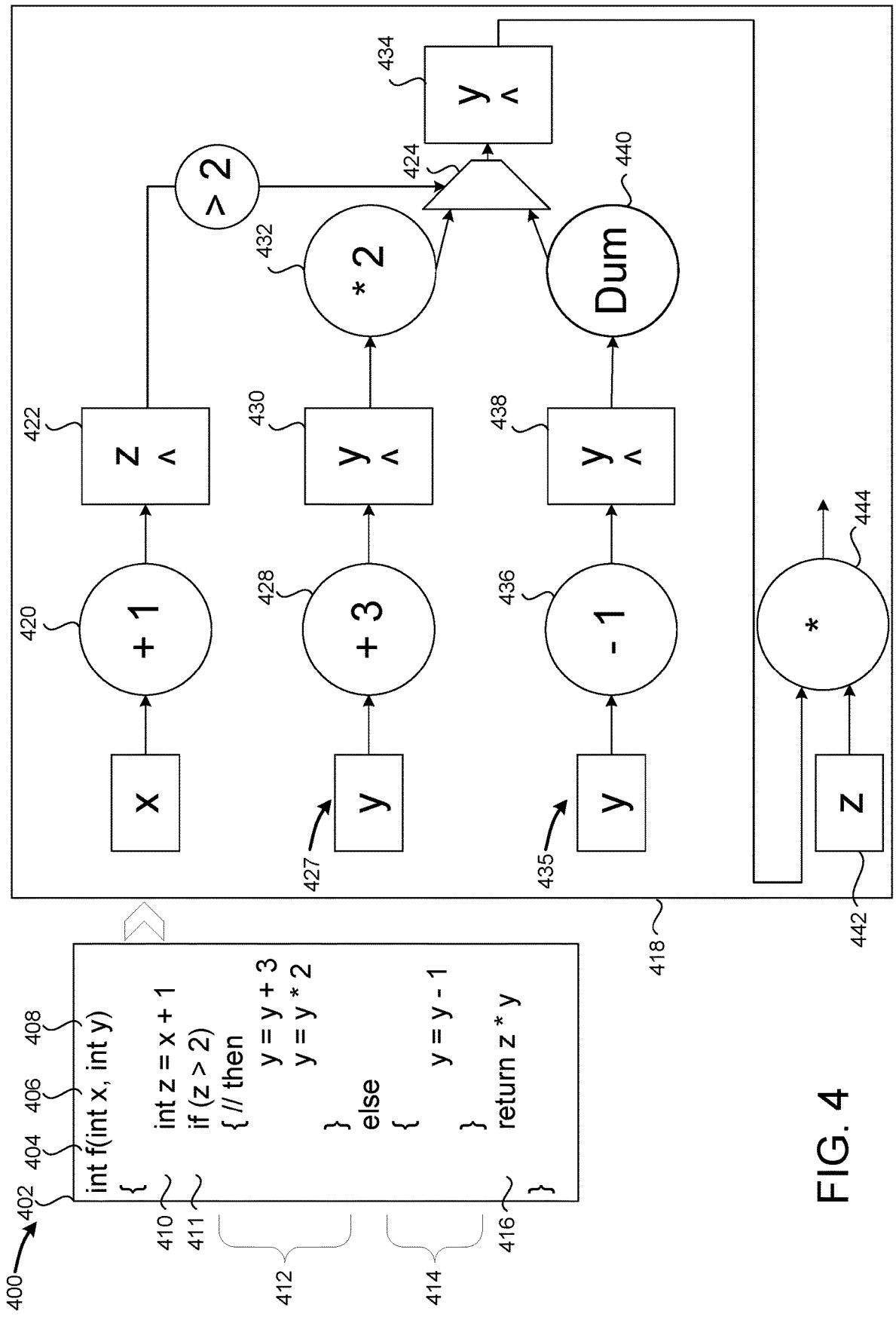
FIG. 4 is a hardware architecture diagram that shows padding code paths of a pipeline with dummy stages.

FIG. 4 is a hardware architecture diagram 400 that shows padding code paths of a pipeline with dummy stages such that all paths of the pipeline have the same number of stages. Having the same number of stages ensures thread execution order is maintained through the pipeline. In some configurations, code listing 402 includes function 'f( )' 404, which accepts two parameters: int 'x' 406 and int 'y' 408. Line 410 adds '1' to 'x' and assigns the value to 'z', which is depicted in the circuit description 418 as computational unit 420 adding '1' to 'x' and storing the result in register 422.

Line 411 introduces an "if" statement with a condition of "z>2". In some configurations, branching statements like 'if' statements are implemented by executing both branches in parallel and choosing which results to proceed with based on the condition. The corresponding component in circuit description 418 is multiplexor 424, which causes a thread to proceed with the values produced by code path 427 if 'z' is greater than '2', and otherwise causes the thread to proceed with the values produced by code path 435 (N).

Code block 412 (the 'then' block) includes two statements. "y=y+3" corresponds to computational unit 428, which adds '3' to the value of 'y' 408. The result is stored in register 430, which the compiler understands to contain the correct value of 'y', replacing the value that was passed in as a parameter. The next statement, "y=y*2", is implemented by computational unit 432, which multiplies the value of 'y' stored in register 430 by '2', and provides the result to multiplexer 424. If the value of 'z' is greater than '2', then the value provided by computational unit 432 will be provided to register 434.

Code block 414 (the 'else' block) includes a single statement: "y=y−1". This statement is implemented by computational unit 436, which subtracts '1' from 'y' 408 and stores the result in register 438. However, on the next clock cycle, a dummy computational unit 440 forwards the value stored in register 438 to multiplexer 424, which provides the value stored in register 438 to register 434 if the value of 'z' is less than or equal to '2'. This dummy computational unit 440 is added to balance the number stages in code path 427. In some configurations, register 438 is added to maintain the value of 'y' for dummy computational unit 440.

In some configurations, the number of dummy computational units added to a given code path equals a the number of stages in the longest code path less the number of stages of the given code path. In this case, the maximum number of stages is two—computational units 428 and 432, and the code path 435 has one stage, 436. As such, only one computational unit 435 is added, causing one new pipeline stage to be created.

In some embodiments, instead of inserting a computational unit that doesn't perform useful work (aside from balancing the branches), values are simply stored in a register at the end of each clock cycle. In some embodiments, instead of adding dummy stages, the compiler generates a deeper pipeline, i.e. generating a code path with more stages than would normally be created. This may have the effect reducing average execution time of a stage as computation is spread out over more stages.

Line 416 includes a single statement "return z*y", which multiplies the value of 'y' by the value of 'z' before returning. This corresponds to computational unit 444, which multiplies the value of 'y' stored in register 434 with the value of 'z'.

Figure 5:
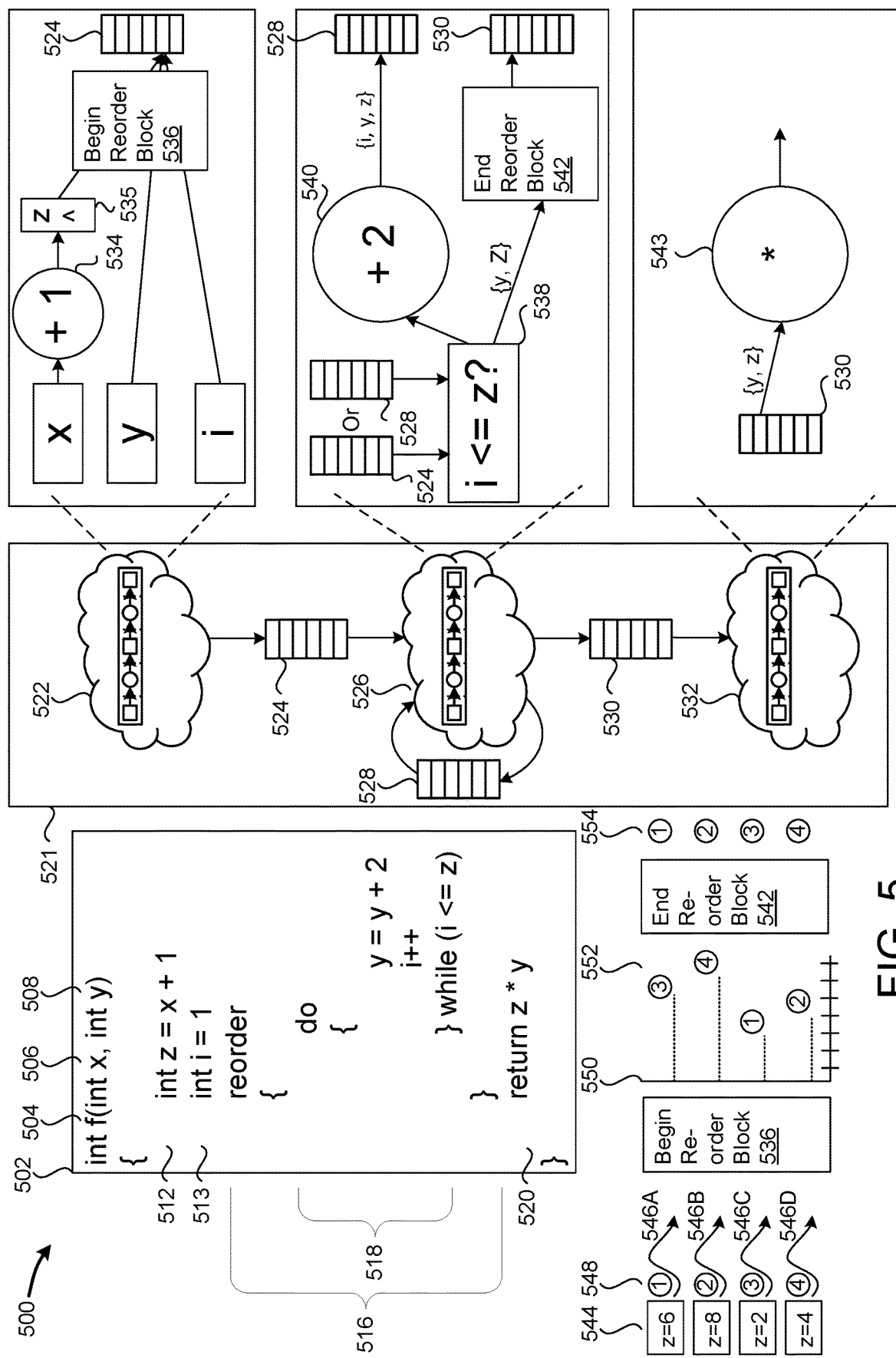
FIG. 5 is a hardware architecture diagram that shows a reorder block construct applied to a for-loop.

FIG. 5 is a hardware architecture diagram 500 that shows a reorder block construct surrounding a "do-while" loop. Code listing 502 includes function 'f( )' 504 that takes parameters 'x' 506 and 'y' 508. Line 512 initializes int 'z' to be "x+1", and corresponds to part of execution pipeline 522. Specifically, execution pipeline 522 includes a "+1" computational unit 534, which adds '1' to the value of 'x' 506 and stores it in register 535 as 'z'. Line 513 initializes T, the loop counter variable, to '1'. Pipeline 522 concludes by pushing the values T, 'y' and 'z' into FIFO 524.

Reorder block 516 of function 504 wraps "do-while" loop 518. FIG. 5 uses "do-while" loop 518 as an example of one kind of language construct that, by design, does not retain thread execution order. However, other language constructs that don't retain thread execution order are similarly contemplated. Reorder block 516 is implemented in part by pipeline 522 and pipeline 526. Pipeline 522 contains begin reorder block 536 which registers threads in the order they enter.

In some configurations, threads are associated with an index or a thread ID. The index/ID of the first thread to enter begin reorder block 536 will be stored in the first position of the reorder block, e.g. in element '0' of an array. Subsequent threads will have their indices/IDs stored in the element corresponding to the order they entered. In this way, a record is created of thread execution order. The discussion of reorder block 516 continues after the discussion of "do-while" loop 518.

"Do-while" loop 518 loops 'z' times, each time adding '2' to 'y'. "Do-while" loop 518 is implemented by pipeline 526, although some aspects are omitted for clarity. "Do-while" loop 518 initially receives the value of 'z' placed in FIFO 524 by pipeline 522. "Do-while" loop 518 may then compare the value of T to 'z' in block 538. If T is less than or equal to 'z', the loop continues, and computational unit 540 adds '2' to 'y'. The updated value of 'y', the value of 'z', and current value of T are then stored in FIFO 528. However, if 'i' is greater than 'z', the loop ends, and execution passes to reorder block 542, as discussed below.

After the initial execution, "do-while" loop 518 continues to iterate another 'z−1' times. At each iteration, the current values of 'y' and T are retrieved from FIFO 528, along with the value of 'z'. It will be appreciated that 'x' is not maintained at this point because it is not used in the remainder of the function. Comparison 538 is performed, and if T is still less than 'z', execution continues to computational unit 540 as discussed above. However, if T is greater than 'z', "do-while" "do-while" loop 518 ends.

As a thread exits "do-while" "do-while" loop 518, it passes through end reorder block 542. While begin reorder block 536 and end reorder block 542 are depicted separately, they may be implemented by a single functional unit on the SDC. End reorder block 542 blocks a thread until all threads with a lower execution order (i.e. threads registered in a lower-numbered element in the array of thread indices/IDs) have been released. When the thread with the lowest execution order is encountered it is immediately released to continue execution. In this way, threads are released to begin other computations in the order they entered the reorder block 516. Pipeline 526 concludes by storing the values of 'z' and 'y' in FIFO 530.

Line 520 executes after "do-while" loop 518 and reorder block 516 have been completed, returning the value of "z*y". Line 520 is implemented in part by pipeline 532, which reads the values of and 'z' from FIFO 530, and applies computational unit 543 to multiply and 'z'.

FIG. 5 depicts how thread order may change by executing a "do-while" loop, and then be restored to the original order by a thread reorder block. Threads 546A-D enter a loop, such as "do-while" "do-while" loop 518, in order 548. Each thread has a different value of 544, and so each thread performs "do-while" loop 518 a different number of iterations. Specifically, thread 546A, which is the first to enter, will iterate six times, thread 546B, which is second to enter, will iterate eight times, thread 546C, which is third to enter, will iterate two times, and thread 546D, which is fourth to enter, will iterate four times. Threads 546 pass through begin reorder block 536, registering their thread indices/IDs in the order they entered. Chart 550 indicates how long each thread executes, in clock cycles. Threads 546 exit "do-while" loop 518 in a different order—thread 546A exists third, thread 546B exits fourth, thread 546B exits first, and thread 546A exits second.

While thread 546C is first to exit "do-while" loop 518, end reorder block 542 delays further execution until threads 546A and 546B have finished "do-while" loop 518 and resumed execution. Next, thread 546D finishes "do-while" loop 518, and is also blocked until threads 546A-C finish. Next, thread 546A finishes "do-while" loop 518, but because 546A was the first thread to register with begin reorder block 536, it is allowed to resume. At the same time, end reorder block 542 checks if any subsequent threads are allowed to continue now that thread 546A has resumed. In this case, there are not, because thread 546B has yet to finish. However, once thread 546B finishes "do-while" loop 518, end reorder block 542 notes that all threads with lower initial execution order (i.e. thread 546A) have resumed execution, so thread 546B is allowed to resume execution. Next, threads that entered begin reorder block 536 after thread 546B are checked to determine if they are allowed to resume. In this example, both threads 546C and 546D are blocked, and so they are both allowed to resume (in that order), because all of the threads that arrived before them have been allowed to resume. In this way, threads 546 exit end reorder block 542 in order 554, i.e. in the same order they entered begin reorder block 536. FIGS. 4 and 5 and corresponding discussions depict non-limiting examples. Other types of loops, pipelines, expressions, branches, and orderings are similarly contemplated.

Figure 6:
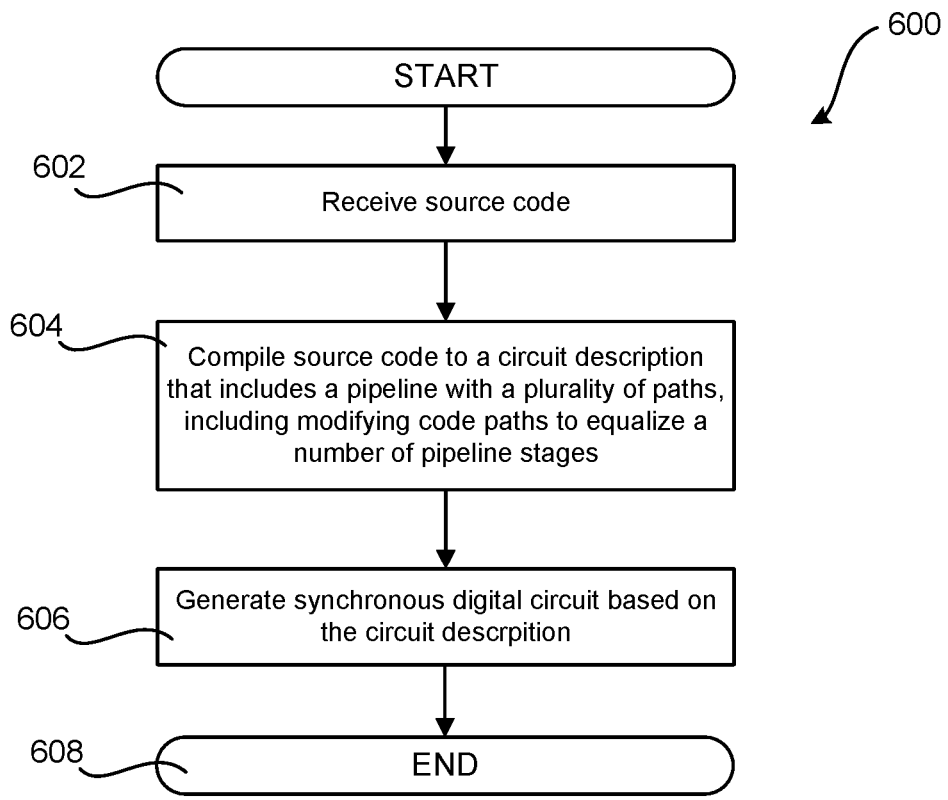
FIG. 6 is a flow diagram showing a routine that illustrates aspects of the operation of the language and compiler that maintains thread execution order described with reference to FIGS. 1-5.

FIG. 6 is a flow diagram showing a routine 600 that illustrates aspects of the language and compiler that maintains thread execution order illustrated in FIGS. 1-5 and described above, according to one embodiment disclosed herein. It should be appreciated that the logical operations described herein with regard to FIG. 6, and the other FIGS., can be implemented (1) as a sequence of computer implemented acts or program modules running on a computing device and/or (2) as interconnected machine logic circuits or circuit modules within a computing device.

The particular implementation of the technologies disclosed herein is a matter of choice dependent on the performance and other requirements of the computing device. Accordingly, the logical operations described herein are referred to variously as states, operations, structural devices, acts, or modules. These states, operations, structural devices, acts and modules can be implemented in hardware, software, firmware, in special-purpose digital logic, and any combination thereof. It should be appreciated that more or fewer operations can be performed than shown in the FIGS. and described herein. These operations can also be performed in a different order than those described herein.

The routine 600 begins at operation 602, where source code 102 is received by a compiler 104. The source code 102 may be expressed in a multi-threaded programming language. In some configurations, the source code 102 is expressed in an imperative programming language. The source code may include a branching statement 411, such as an 'if', 'switch', 'case', or 'while' statement, that causes a thread to execute on one of a plurality of code paths (also referred to as "source code paths", to distinguish from code paths described in the circuit). In some configurations, the source code includes a reorder block 516 that wraps code that does not maintain thread execution order, such as a "do-while" loop 518.

From operation 602, the routine proceeds to operation 604, where the compiler 104 compiles the source code 102 to a circuit description 106. In some configurations, the circuit description 106 includes a plurality of code paths 427, 435 associated with the plurality of source code paths, and the compiler 104 adds dummy pipeline stages 440 to some or all of the plurality of code paths so that some or all of the plurality of code paths have the same number of pipeline stages 324.

In some configurations, the circuit description includes a first execution pipeline 200A and a second execution pipeline 200B, and the first execution pipeline 200A hands off execution to the second execution pipeline 200B by pushing sets of local variables to a FIFO 202A. The second execution pipeline 200B may then retrieve sets of local variables from the FIFO 202A in the order they were pushed, thereby maintaining thread execution order.

In some configurations, the circuit description 521 includes a reorder buffer 536, 542 that wraps a circuit description of a construct 518 that does not maintain thread execution order. In these configurations, the reorder buffer 536, 542 registers thread order 548 before the construct is executed, and returns threads to the original execution order 548 upon leaving the construct. In some configurations, the reorder buffer 536, 542 blocks thread execution until all of the threads with a lower execution order (i.e. closer to the first thread to execute) have resumed execution.

From operation 604, the routine 600 proceeds to operation 606, where the circuit description (e.g. HDL code) is utilized to generate an SDL 112 that includes the circuit implementation defined by the circuit description 106. The routine 600 then proceeds from operation 606 to operation 608, where it ends.

Figure 7:
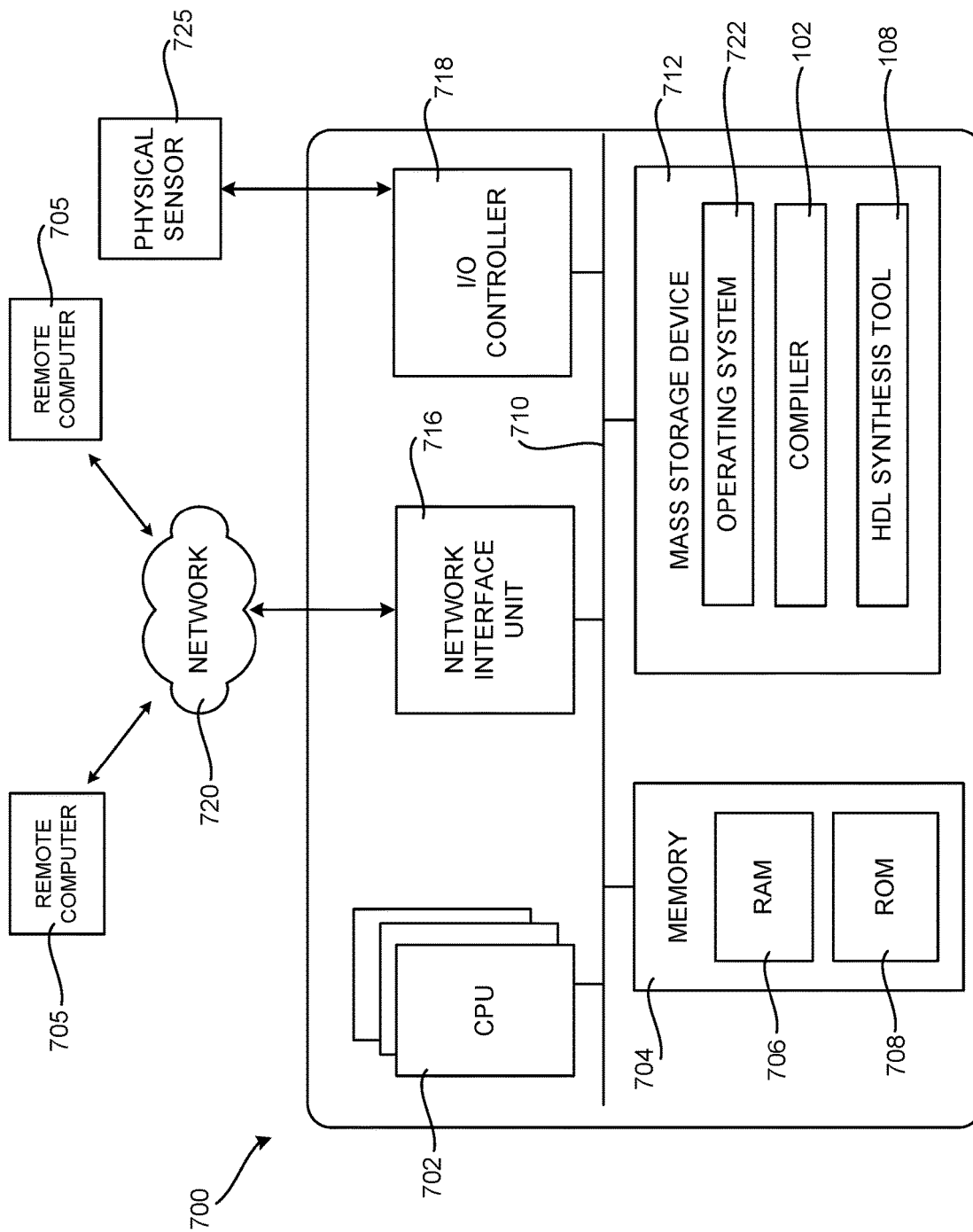
FIG. 7 is a computer architecture diagram showing an illustrative computer hardware and software architecture for a computing device that can implement aspects of the technologies presented herein.

FIG. 7 is a computer architecture diagram showing an illustrative computer hardware and software architecture for a computing device that can implement the various technologies presented herein. In particular, the architecture illustrated in FIG. 7 can be utilized to implement a server computer, mobile phone, an e-reader, a smartphone, a desktop computer, an AR/VR device, a tablet computer, a laptop computer, or another type of computing device.

The computer 700 illustrated in FIG. 7 includes a central processing unit 702 ("CPU"), a system memory 704, including a random-access memory 706 ("RAM") and a read-only memory ("ROM") 708, and a system bus 710 that couples the memory 704 to the CPU 702. A basic input/output system ("BIOS" or "firmware") containing the basic routines that help to transfer information between elements within the computer 700, such as during startup, can be stored in the ROM 708. The computer 700 further includes a mass storage device 712 for storing an operating system 722, application programs, and other types of programs. The mass storage device 712 can also be configured to store other types of programs and data.

The mass storage device 712 is connected to the CPU 702 through a mass storage controller (not shown) connected to the bus 710. The mass storage device 712 and its associated computer readable media provide non-volatile storage for the computer 700. Although the description of computer readable media contained herein refers to a mass storage device, such as a hard disk, CD-ROM drive, DVD-ROM drive, or USB storage key, it should be appreciated by those skilled in the art that computer readable media can be any available computer storage media or communication media that can be accessed by the computer 700.

Communication media includes computer readable instructions, data structures, program modules, or other data in a modulated data signal such as a carrier wave or other transport mechanism and includes any delivery media. The term "modulated data signal" means a signal that has one or more of its characteristics changed or set in a manner so as to encode information in the signal. By way of example, and not limitation, communication media includes wired media such as a wired network or direct-wired connection, and wireless media such as acoustic, radio frequency, infrared and other wireless media. Combinations of the any of the above should also be included within the scope of computer readable media.

By way of example, and not limitation, computer storage media can include volatile and non-volatile, removable and non-removable media implemented in any method or technology for storage of information such as computer readable instructions, data structures, program modules or other data. For example, computer storage media includes, but is not limited to, RAM, ROM, EPROM, EEPROM, flash memory or other solid-state memory technology, CD-ROM, digital versatile disks ("DVD"), HD-DVD, BLU-RAY, or other optical storage, magnetic cassettes, magnetic tape, magnetic disk storage or other magnetic storage devices, or any other medium that can be used to store the desired information and which can be accessed by the computer 700. For purposes of the claims, the phrase "computer storage medium," and variations thereof, does not include waves or signals per se or communication media.

According to various configurations, the computer 700 can operate in a networked environment using logical connections to remote computers through a network such as the network 720. The computer 700 can connect to the network 720 through a network interface unit 716 connected to the bus 710. It should be appreciated that the network interface unit 716 can also be utilized to connect to other types of networks and remote computer systems. The computer 700 can also include an input/output controller 718 for receiving and processing input from a number of other devices, including a keyboard, mouse, touch input, an electronic stylus (not shown in FIG. 7), or a physical sensor such as a video camera. Similarly, the input/output controller 718 can provide output to a display screen or other type of output device (also not shown in FIG. 7).

It should be appreciated that the software components described herein, when loaded into the CPU 702 and executed, can transform the CPU 702 and the overall computer 700 from a general-purpose computing device into a special-purpose computing device customized to facilitate the functionality presented herein. The CPU 702 can be constructed from any number of transistors or other discrete circuit elements, which can individually or collectively assume any number of states. More specifically, the CPU 702 can operate as a finite-state machine, in response to executable instructions contained within the software modules disclosed herein. These computer-executable instructions can transform the CPU 702 by specifying how the CPU 702 transitions between states, thereby transforming the transistors or other discrete hardware elements constituting the CPU 702.

Encoding the software modules presented herein can also transform the physical structure of the computer readable media presented herein. The specific transformation of physical structure depends on various factors, in different implementations of this description. Examples of such factors include, but are not limited to, the technology used to implement the computer readable media, whether the computer readable media is characterized as primary or secondary storage, and the like. For example, if the computer readable media is implemented as semiconductor-based memory, the software disclosed herein can be encoded on the computer readable media by transforming the physical state of the semiconductor memory. For instance, the software can transform the state of transistors, capacitors, or other discrete circuit elements constituting the semiconductor memory. The software can also transform the physical state of such components in order to store data thereupon.

As another example, the computer readable media disclosed herein can be implemented using magnetic or optical technology. In such implementations, the software presented herein can transform the physical state of magnetic or optical media, when the software is encoded therein. These transformations can include altering the magnetic characteristics of particular locations within given magnetic media. These transformations can also include altering the physical features or characteristics of particular locations within given optical media, to change the optical characteristics of those locations. Other transformations of physical media are possible without departing from the scope and spirit of the present description, with the foregoing examples provided only to facilitate this discussion.

In light of the above, it should be appreciated that many types of physical transformations take place in the computer 700 in order to store and execute the software components presented herein. It also should be appreciated that the architecture shown in FIG. 7 for the computer 700, or a similar architecture, can be utilized to implement other types of computing devices, including hand-held computers, video game devices, embedded computer systems, mobile devices such as smartphones, tablets, and AR/VR devices, and other types of computing devices known to those skilled in the art. It is also contemplated that the computer 700 might not include all of the components shown in FIG. 7, can include other components that are not explicitly shown in FIG. 7, or can utilize an architecture completely different than that shown in FIG. 7.

Figure 8:
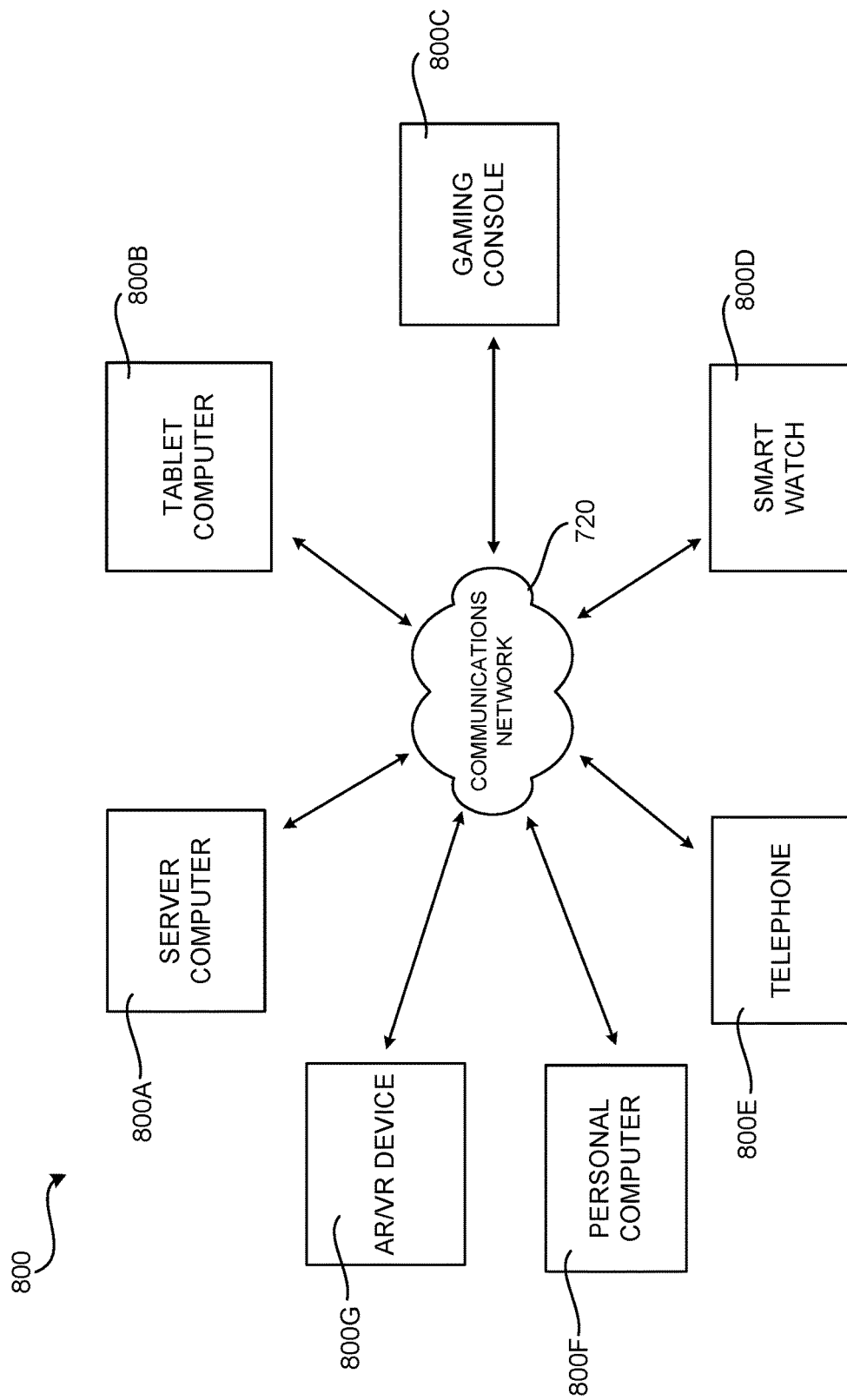
FIG. 8 is a network diagram illustrating a distributed computing environment in which aspects of the disclosed technologies can be implemented.

FIG. 8 is a network diagram illustrating a distributed network computing environment 800 in which aspects of the disclosed technologies can be implemented, according to various embodiments presented herein. As shown in FIG. 8, one or more server computers 800A can be interconnected via a communications network 720 (which may be either of, or a combination of, a fixed-wire or wireless LAN, WAN, intranet, extranet, peer-to-peer network, virtual private network, the Internet, Bluetooth communications network, proprietary low voltage communications network, or other communications network) with a number of client computing devices such as, but not limited to, a tablet computer 800B, a gaming console 800C, a smart watch 800D, a telephone 800E, such as a smartphone, a personal computer 800F, and an AR/VR device 800G.

In a network environment in which the communications network 720 is the Internet, for example, the server computer 800A can be a dedicated server computer operable to process and communicate data to and from the client computing devices 800B-800G via any of a number of known protocols, such as, hypertext transfer protocol ("HTTP"), file transfer protocol ("FTP"), or simple object access protocol ("SOAP"). Additionally, the networked computing environment 800 can utilize various data security protocols such as secured socket layer ("SSL") or pretty good privacy ("PGP"). Each of the client computing devices 800B-800G can be equipped with an operating system operable to support one or more computing applications or terminal sessions such as a web browser (not shown in FIG. 8), or other graphical user interface (not shown in FIG. 8), or a mobile desktop environment (not shown in FIG. 8) to gain access to the server computer 800A.

The server computer 800A can be communicatively coupled to other computing environments (not shown in FIG. 8) and receive data regarding a participating user's interactions/resource network. In an illustrative operation, a user (not shown in FIG. 8) may interact with a computing application running on a client computing device 800B-800G to obtain desired data and/or perform other computing applications.

The data and/or computing applications may be stored on the server 800A, or servers 800A, and communicated to cooperating users through the client computing devices 800B-800G over an exemplary communications network 720. A participating user (not shown in FIG. 8) may request access to specific data and applications housed in whole or in part on the server computer 800A. These data may be communicated between the client computing devices 800B-800G and the server computer 800A for processing and storage.

The server computer 800A can host computing applications, processes and applets for the generation, authentication, encryption, and communication of data and applications, and may cooperate with other server computing environments (not shown in FIG. 8), third party service providers (not shown in FIG. 8), network attached storage ("NAS") and storage area networks ("SAN") to realize application/data transactions.

It should be appreciated that the computing architecture shown in FIG. 7 and the distributed network computing environment shown in FIG. 8 have been simplified for ease of discussion. It should also be appreciated that the computing architecture and the distributed computing network can include and utilize many more computing components, devices, software programs, networking devices, and other components not specifically described herein.

The disclosure presented herein also encompasses the subject matter set forth in the following clauses:

Clause 1: A computer-implemented method, comprising: receiving source code expressed in a multi-threaded programming language, wherein the source code includes a branching statement that directs execution to one of a plurality of source code paths; compiling the source code to a circuit description that includes a pipeline, wherein the pipeline includes a plurality of code paths associated with the plurality of source code paths, and wherein one or more pipeline stages are added to one or more of the plurality of code paths so that the plurality of code paths have a same number of pipeline stages; and generating, based on the circuit description, a synchronous digital circuit comprising the circuit implementation.

Clause 2: The computer-implemented method of clause 1, wherein a plurality of threads enter the pipeline in a first order, and wherein the plurality of threads leave the pipeline in the first order.

Clause 3: The computer-implemented method of any of clauses 1-2, wherein adding pipeline stages to one or more of the plurality of code paths includes determining a number of pipeline stages in a longest code path and adding a number of pipeline stages to each code path equal to the number of pipeline stages in the longest code path minus the number of pipeline stages in that code path.

Clause 4: The computer-implemented method of any of clauses 1-3, wherein the pipeline comprises a first pipeline, wherein the circuit description includes a second pipeline, wherein a thread executing the first pipeline transfers execution to the second pipeline by pushing local variables into a first-in-first-out queue, and wherein the second pipeline maintains thread execution order across pipelines by reading local variables out of the first-in-first-out queue in the order they were pushed.

Clause 5: The computer-implemented method of any of clauses 1-4, wherein the source code includes a reorder block construct that that wraps a programming construct that does not maintain thread execution order, and wherein the reorder block construct maps to a circuit implementation that: records an incoming thread execution order, allows threads to execute the construct that does not maintain thread execution order, and blocks threads from resuming until all lower-ordered threads have resumed.

Clause 6: The computer-implemented method of any of clauses 1-5, wherein a thread comprises a collection of local variables provided to the pipeline for execution.

Clause 7: The computer-implemented method of any of clauses 1-6, wherein the pipeline comprises stages executed in sequence, and wherein a plurality of threads maintain execution order by flowing through the stages in the sequence.

Clause 8: A computing device: one or more processors; and at least one computer storage medium having computer executable instructions stored thereon which, when executed by the one or more processors, cause the computing device to: receive source code expressed in a multi-threaded programming language; compile the source code to a circuit description that includes a first pipeline, a second pipeline, and a first-in-first-out (FIFO) queue that stores sets of local thread variables passed from the first pipeline to the second pipeline, wherein the first pipeline stores sets of local thread variables in the FIFO queue in a thread execution order, and wherein the second pipeline maintains the thread execution order by retrieving sets of local thread variables from the FIFO queue in the thread execution order; and generating, based on the circuit description, a synchronous digital circuit comprising the circuit implementation.

Clause 9: The computing device of clause 8, wherein the source code includes a branching statement that directs execution to one of a plurality of source code paths; wherein the first pipeline includes a plurality of code paths associated with the plurality of source code paths, and wherein one or more pipeline stages are added to one or more of the plurality of code paths so that the plurality of code paths have a same number of pipeline stages.

Clause 10: The computing device of any of clauses 8-9, wherein adding pipeline stages to one or more of the plurality of code paths includes determining a number of pipeline stages in a longest code path and adding a number of pipeline stages to each code path equal to the number of pipeline stages in the longest code path minus the number of pipeline stages in that code path.

Clause 11: The computing device of any of clauses 8-10, wherein the source code includes a reorder block construct that that wraps a programming construct that does not maintain thread execution order, and wherein the reorder block construct maps to a circuit implementation that: records an incoming thread execution order, allows threads to execute the construct that does not maintain thread execution order, and blocks threads from resuming until all lower-ordered threads have resumed.

Clause 12: The computing device of any of clauses 8-11, wherein threads leave the reorder block in the order they entered it.

Clause 13: The computing device of any of clauses 8-12, wherein a thread comprises a collection of local thread variables provided to the first pipeline for execution.

Clause 14: The computing device of any of clauses 8-13, wherein the first pipeline comprises stages executed in sequence, and wherein a plurality of threads maintain execution order by flowing through the stages in the sequence.

Clause 15: At least one computer storage medium having computer executable instructions stored thereon which, when executed by one or more processors, cause a computing device to: receive source code expressed in a multi-threaded programming language, the source code comprising a construct that maps to a circuit implementation, the construct comprising a reorder block and a construct that does not maintain thread execution order, wherein the circuit implementation comprises: a reorder buffer that registers thread identifiers in an order in which a plurality of threads are received; a circuit that executes for an unknown number of clock cycles for each of the plurality of threads; wherein the reorder buffer blocks a thread from resuming until all threads having a lower execution order are resumed; compile the construct to a circuit description; and generate, based on the circuit description, a synchronous digital circuit comprising the circuit implementation.

Clause 16: The at least one computer storage medium of clause 15, wherein the source code includes a branching statement that directs execution to one of a plurality of source code paths; wherein the circuit description includes a pipeline that includes a plurality of code paths, and wherein one or more pipeline stages are added to one or more of the plurality of code paths so that the plurality of code paths have a same number of pipeline stages.

Clause 17: The at least one computer storage medium of any of clauses 15-16, wherein adding pipeline stages to one or more of the plurality of code paths includes determining a number of pipeline stages in a longest code path and adding a number of pipeline stages to each code path equal to the number of pipeline stages in the longest code path minus the number of pipeline stages in that code path.

Clause 18: The at least one computer storage medium of any of clauses 15-17, wherein a thread comprises a collection of local thread variables provided to the first pipeline for execution.

Clause 19: The at least one computer storage medium of any of clauses 15-17, wherein the first pipeline comprises stages executed in sequence, and wherein a plurality of threads maintain execution order by flowing through the stages in the sequence.

Clause 20: The at least one computer storage medium of any of clauses 15-19, wherein the pipeline comprises a first pipeline, wherein the circuit description includes a second pipeline, wherein a thread executing the first pipeline transfers execution to the second pipeline by pushing local variables into a first-in-first-out queue, and wherein the second pipeline maintains thread execution order across pipelines by reading local variables out of the first-in-first-out queue in the order they were pushed.

Based on the foregoing, it should be appreciated that a language and compiler that maintains thread execution order has been disclosed herein. Although the subject matter presented herein has been described in language specific to computer structural features, methodological and transformative acts, specific computing machinery, and computer readable media, it is to be understood that the subject matter set forth in the appended claims is not necessarily limited to the specific features, acts, or media described herein. Rather, the specific features, acts and mediums are disclosed as example forms of implementing the claimed subject matter.

The subject matter described above is provided by way of illustration only and should not be construed as limiting. Various modifications and changes can be made to the subject matter described herein without following the example configurations and applications illustrated and described, and without departing from the scope of the present disclosure, which is set forth in the following claims.

What is claimed is:

1. A computer-implemented method, comprising:
   receiving source code expressed in a multi-threaded programming language, wherein the source code includes a branching statement that directs execution to one of a plurality of source code paths;
   compiling the source code to a circuit description that includes a pipeline, wherein the pipeline includes a plurality of code paths associated with the plurality of source code paths, wherein the compiling comprises:
      determining a number of pipeline stages in a code path of the plurality of code paths that has a largest number of pipeline stages, and
      adding pipeline stages to at least one of the plurality of code paths until each of the plurality of code paths has the number of pipeline stages; and
   generating, based on the circuit description, a synchronous digital circuit comprising the circuit implementation.

2. The computer-implemented method of claim 1, wherein a plurality of threads enter the pipeline in a first order, and wherein the plurality of threads leave the pipeline in the first order.

3. The computer-implemented method of claim 1, wherein adding pipeline stages to one or more of the plurality of code paths includes determining a number of pipeline stages in a longest code path and adding a number of pipeline stages to each code path equal to the number of pipeline stages in the longest code path minus the number of pipeline stages in that code path.

4. The computer-implemented method of claim 1, wherein the pipeline comprises a first pipeline, wherein the circuit description includes a second pipeline, wherein a thread executing the first pipeline transfers execution to the second pipeline by pushing local variables into a first-in-first-out queue, and wherein the second pipeline maintains thread execution order across pipelines by reading local variables out of the first-in-first-out queue in the order they were pushed.

5. The computer-implemented method of claim 1, wherein the source code includes a reorder block construct that wraps a programming construct that does not maintain thread execution order, and wherein the reorder block construct maps to a circuit implementation that:
 records an incoming thread execution order,
 allows threads to execute the construct that does not maintain thread execution order, and
 blocks threads from resuming until all lower-ordered threads have resumed.

6. The computer-implemented method of claim 1, wherein at least one of the added pipeline stages comprises a computational unit and is configured to store a result generated by the computational unit in a register.

7. The computer-implemented method of claim 1, wherein the pipeline comprises stages executed in sequence, and wherein a plurality of threads maintain execution order by flowing through the stages in the sequence.

8. A computing device, comprising:
 one or more processors; and
 at least one computer storage medium having computer executable instructions stored thereon which, when executed by the one or more processors, cause the computing device to:
  receive source code expressed in a multi-threaded programming language;
  compile the source code to a circuit description that includes a first pipeline, a second pipeline, and a first-in-first-out (FIFO) queue that stores sets of local thread variables passed from the first pipeline to the second pipeline, wherein the first pipeline stores sets of local thread variables in the FIFO queue in a thread execution order, wherein the second pipeline maintains the thread execution order by retrieving sets of local thread variables from the FIFO queue in the thread execution order, and wherein the source code includes a branching statement that directs execution to one of a plurality of source code paths; wherein the first pipeline includes a plurality of code paths associated with the plurality of source code paths, wherein one or more pipeline stages are added to one or more of the plurality of code paths so that the plurality of code paths have a same number of pipeline stages, and wherein at least one of the added pipeline stages comprises a computational unit and is configured to store a result generated by the computation unit in a register; and
  generating, based on the circuit description, a synchronous digital circuit comprising the circuit implementation.

9. The computing device of claim 8, wherein adding pipeline stages to one or more of the plurality of code paths includes determining a number of pipeline stages in a longest code path and adding a number of pipeline stages to each code path equal to the number of pipeline stages in the longest code path minus the number of pipeline stages in that code path.

10. The computing device of claim 8, wherein the source code includes a reorder block construct that wraps a programming construct that does not maintain thread execution order, and wherein the reorder block construct maps to a circuit implementation that:
 records an incoming thread execution order,
 allows threads to execute the construct that does not maintain thread execution order, and
 blocks threads from resuming until all lower-ordered threads have resumed.

11. The computing device of claim 10, wherein threads leave the reorder block in the order they entered it.

12. The computing device of claim 8, wherein a thread comprises a collection of local thread variables provided to the first pipeline for execution.

13. The computing device of claim 8, wherein the first pipeline comprises stages executed in sequence, and wherein a plurality of threads maintain execution order by flowing through the stages in the sequence.

14. At least one computer storage medium having computer executable instructions stored thereon which, when executed by one or more processors, cause a computing device to:
 receive source code expressed in a multi-threaded programming language, the source code comprising a construct that maps to a circuit implementation, the construct comprising a reorder block and a construct that does not maintain thread execution order, wherein the circuit implementation comprises:
  a reorder buffer that registers thread identifiers in an order in which a plurality of threads are received;
  a circuit that executes for an unknown number of clock cycles for each of the plurality of threads; wherein the reorder buffer blocks a thread from resuming until all threads having a lower execution order are resumed;
 compile the construct to a circuit description; and
 generate, based on the circuit description, a synchronous digital circuit comprising the circuit implementation.

15. The at least one computer storage medium of claim 14, wherein the source code includes a branching statement that directs execution to one of a plurality of source code paths; wherein the circuit description includes a pipeline that includes a plurality of code paths, and wherein one or more pipeline stages are added to one or more of the plurality of code paths so that the plurality of code paths have a same number of pipeline stages.

16. The at least one computer storage medium of claim 15, wherein adding pipeline stages to one or more of the plurality of code paths includes determining a number of pipeline stages in a longest code path and adding a number of pipeline stages to each code path equal to the number of pipeline stages in the longest code path minus the number of pipeline stages in that code path.

17. The at least one computer storage medium of claim 15, wherein a thread comprises a collection of local thread variables provided to the first pipeline for execution.

18. The at least one computer storage medium of claim 15, wherein the first pipeline comprises stages executed in sequence, and wherein a plurality of threads maintain execution order by flowing through the stages in the sequence.

19. The at least one computer storage medium of claim 15, wherein the pipeline comprises a first pipeline, wherein the circuit description includes a second pipeline, wherein a thread executing the first pipeline transfers execution to the second pipeline by pushing local variables into a first-in-first-out queue, and wherein the second pipeline maintains thread execution order across pipelines by reading local variables out of the first-in-first-out queue in the order they were pushed.

* * * * *